United States Patent
Fujimaki

(10) Patent No.: US 8,643,416 B2
(45) Date of Patent: Feb. 4, 2014

(54) SEMICONDUCTOR DEVICE INCLUDING A DELAY LOCKED LOOP CIRCUIT

(75) Inventor: Ryo Fujimaki, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 13/451,131

(22) Filed: Apr. 19, 2012

(65) Prior Publication Data

US 2012/0268181 A1    Oct. 25, 2012

(30) Foreign Application Priority Data

Apr. 20, 2011 (JP) ................................. 2011-094264

(51) Int. Cl.
H03L 7/00 (2006.01)

(52) U.S. Cl.
USPC ............ 327/160; 327/158; 327/161; 713/401

(58) Field of Classification Search
USPC ................. 327/149, 151, 153, 158, 160, 161; 713/401
See application file for complete search history.

(56) References Cited

U.S. PATENT DOCUMENTS

| | | | | |
|---|---|---|---|---|
| 6,836,166 B2 * | 12/2004 | Lin et al. | ........................ | 327/158 |
| 6,909,311 B2 * | 6/2005 | Foley et al. | .................... | 327/141 |
| 6,917,229 B2 * | 7/2005 | Cho | ............................... | 327/158 |
| 7,002,384 B1 * | 2/2006 | Chong et al. | .................. | 327/158 |
| 7,190,201 B2 * | 3/2007 | Haerle et al. | .................. | 327/158 |
| 7,265,594 B2 * | 9/2007 | Nakamura et al. | ............ | 327/141 |
| 7,433,262 B2 * | 10/2008 | Vergnes et al. | ............. | 365/233.1 |
| 7,616,708 B2 * | 11/2009 | Chen et al. | .................... | 375/326 |
| 7,737,746 B2 | 6/2010 | Shin | | |
| 2010/0201413 A1 | 8/2010 | Miyano | | |
| 2011/0058437 A1 * | 3/2011 | Miyano | ......................... | 365/222 |
| 2013/0009683 A1 * | 1/2013 | Ichida | ........................... | 327/158 |
| 2013/0229214 A1 * | 9/2013 | Ichida | ........................... | 327/158 |

FOREIGN PATENT DOCUMENTS

| | | |
|---|---|---|
| JP | 2009-141954 A | 6/2009 |
| JP | 2010-187229 A | 8/2010 |

* cited by examiner

*Primary Examiner* — William Hernandez
(74) *Attorney, Agent, or Firm* — McGinn IP Law Group, PLLC

(57) ABSTRACT

A semiconductor device includes a DLL circuit, which comprises: a delay unit generating a second clock signal by delaying a first clock signal; a phase comparator circuit comparing the first clock signal and a signal generated by further delaying the second clock signal; a counter circuit outputting a count value that determines a delay amount of the delay unit to the delay unit, and up/down operating in response to the result of the phase comparison by the phase comparator circuit; and an initial delay amount control circuit detecting a cycle of the first clock signal at the time of initial setting operation, and outputting an initial value of the count value depending upon the detected cycle to the counter circuit.

13 Claims, 11 Drawing Sheets

SEMICONDUCTOR DEVICE INCLUDING A DELAY LOCKED LOOP CIRCUIT

REFERENCE TO RELATED APPLICATION

This application is based upon and claims the benefit of the priority of Japanese patent application No. 2011-094264, filed on Apr. 20, 2011, the disclosure of which is incorporated herein in its entirety by reference thereto.

This invention relates to a semiconductor device, and particularly relates to a semiconductor device including a DLL (Delay Locked Loop) circuit.

TECHNICAL FIELD

Background

In recent years, a synchronous memory that performs in synchronization with a clock signal has been widely used as a main memory for a personal computer and the like. In particular, in a synchronous memory of a DDR (Double Data Rate) type among various types of synchronous memories, a DLL circuit that generates an internal clock signal synchronized with an external clock signal is essential because it is necessary to synchronize input/output data with the external clock signal precisely.

Patent Document 1 discloses a DLL circuit including: initial delay monitoring means that generates an initial setting code according to a phase difference between a reference clock signal and a feedback clock signal at an operation start time point; a shift register that generates a delay control code in response to the initial setting code; and a delay line that delays the reference clock signal in response to the delay control code. According to the DLL circuit mentioned above, such an effect is obtained that the DLL circuit has a fast locking time by monitoring the phase of the feedback clock signal at the time of initial operation and setting the delay control code based on the result of the monitoring operation.

Patent Document 2 disclosed a DLL circuit comprising: a phase determination circuit that generates a phase determination signal based on a phase of a first clock signal; a first counter circuit that updates a count value in each sampling period based on the phase determination signal; a first delay line that generates a second clock signal by delaying the first clock signal based on the count value; and a first invalidation circuit that invalidates a change of the phase determination signal within the same sampling period in response to a fact that the phase determination signal indicates a first logical level. According to the DLL circuit described above, in a case where a determination signal varies within a sampling period, the determination signal is held to a predetermined logical level by the invalidation circuit, which makes it possible to exclude a component that affects the determination signal in a short period, such as a noise or jitter component.

[Patent Document 1]:
JP Patent Kokai Publication No. JP-P2009-141954A, which corresponds to U.S. Pat. No. 7,737,746B2

[Patent Document 2]:
JP Patent Kokai Publication No. JP-P2010-187229A, which corresponds to US2010/201413A1

SUMMARY

The disclosures of above cited Patent Documents are incorporated herein in their entirety by reference thereto. The following analysis has been made in view of the present invention.

Meanwhile, when a semiconductor device is designed, the semiconductor device is desired to operate within a predetermined range of frequencies. Therefore, it is preferable that a DLL circuit included in the semiconductor device adjusts respective clock signals of various frequencies within a predetermined period so as to have desired phases corresponding to respective frequencies in order to expand the versatility of the DLL circuit.

However, since according to a conventional technology a DLL circuit does not have a function adjusting clock signals so as to have respective desired phases in response to the clock signals of various frequencies at the time of initial setting operation, it is difficult to finish adjusting the DLL circuit fast. Thus there is much to be desired in the art.

Based on the above circumstances, the inventor of the present application thought as follows. Considering an adjustment range in which a DLL circuit should adjust for each of frequencies of received clock signals, it is preferred that the adjustment range is different for each of frequencies so that a delay amount for adjusting is small when a clock signal is in a range of high frequencies (the cycle of the clock signal is short), whereas a delay amount for adjusting is large when a clock signal is in a range of low frequencies (the cycle of the clock signal is long). Thus, the inventor of the present application has arrived at the idea of the present disclosure.

In one aspect of the present disclosure, there is provided a semiconductor device comprising a DLL circuit. The DLL circuit comprises: a delay unit generating a second clock signal by delaying a first clock signal; a phase comparator circuit comparing the first clock signal and a signal generated by further delaying the second clock signal; a counter circuit outputting a count value that determines a delay amount of the delay unit to the delay unit, and up/down operating in response to the result of the phase comparison by the phase comparator circuit; and an initial delay amount control circuit detecting a cycle of the first clock signal at the time of initial setting operation, and outputting an initial value of the count value depending upon the detected cycle to the counter circuit.

According to the present disclosure, a delay amount of the delay unit is determined by providing an initial value of the count value depending upon the cycle of the first clock signal to the counter circuit at the time of initial setting operation, which makes it possible to finish adjusting the DLL circuit fast regardless of the frequency of the first clock signal.

PREFERRED MODES

Figure 1:
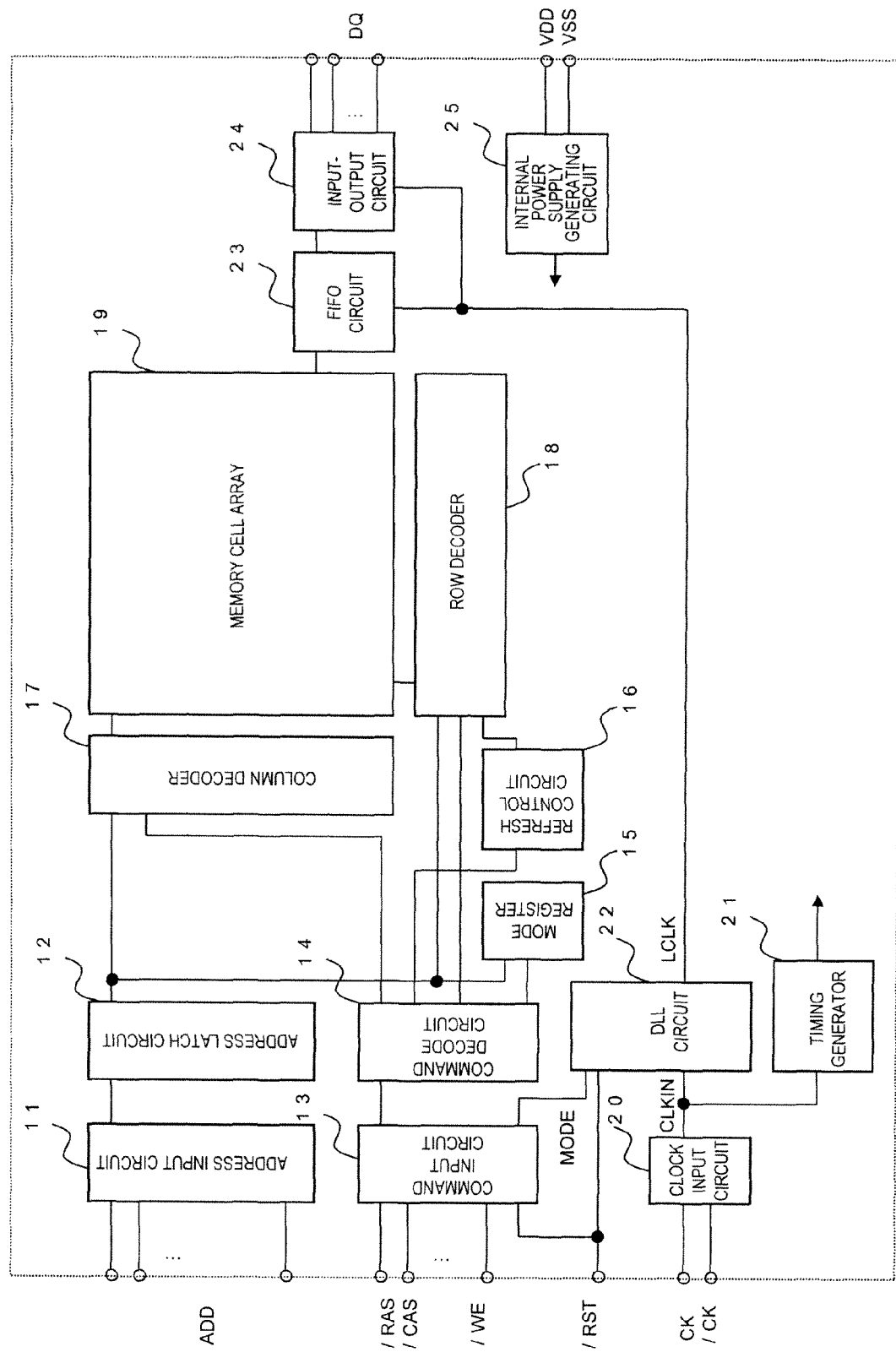
FIG. 1 is a diagram illustrating a configuration of a semiconductor device in accordance with a first exemplary embodiment of the present disclosure.

An outline of the preferred modes of the present invention will be described below. Furthermore, drawing reference symbols described in the following outline are shown only as examples in order to assist understanding, and are not intended to limit the present disclosure to the illustrated modes.

A semiconductor device in accordance with one exemplary embodiment of the present invention comprises a DLL circuit. The DLL circuit comprises: a delay unit (corresponding to 33, 34 in FIG. 2) generating a second clock signal (LCLK in FIG. 2) by delaying a first clock signal (CLKIN in FIG. 2); a phase comparator circuit (36 in FIG. 2) comparing the first clock signal and a signal generated by further delaying the second clock signal; a counter cult (37 in outputting a count value that determines a delay amount of the delay unit to the delay unit, and up/down operating in response to the result of the phase comparison by the phase comparator circuit; and an initial delay amount control circuit (30 in FIG. 2) detecting a cycle of the first clock signal at the time of initial setting operation, and outputting an initial value of the count value depending upon the detected cycle to the counter circuit.

In the semiconductor device, the initial delay amount control circuit may comprise: a pulse signal generating unit (corresponding to DL11, DL12, EXOR1, and DL13 in FIG. 3) generating a pulse signal having a pulse width proportional to the cycle of the first clock signal; a plurality of delay elements (corresponding to DL21 to DL2m in FIG. 3) connected in series delaying the pulse signal; a detection unit (32 in FIG. 4, where not including 40) detecting which of a plurality of delay elements the pulse signal is transmitted to during the pulse width of the pulse signal; and a code generation unit (40 in FIG. 4) generating the initial value of the count value based on the result detected by the detection unit.

In the semiconductor device, the initial delay amount control circuit may count number of pulses included in the first clock signal during a predetermined period, and generates the initial value of the count value based on the result of the count.

Figure 10:
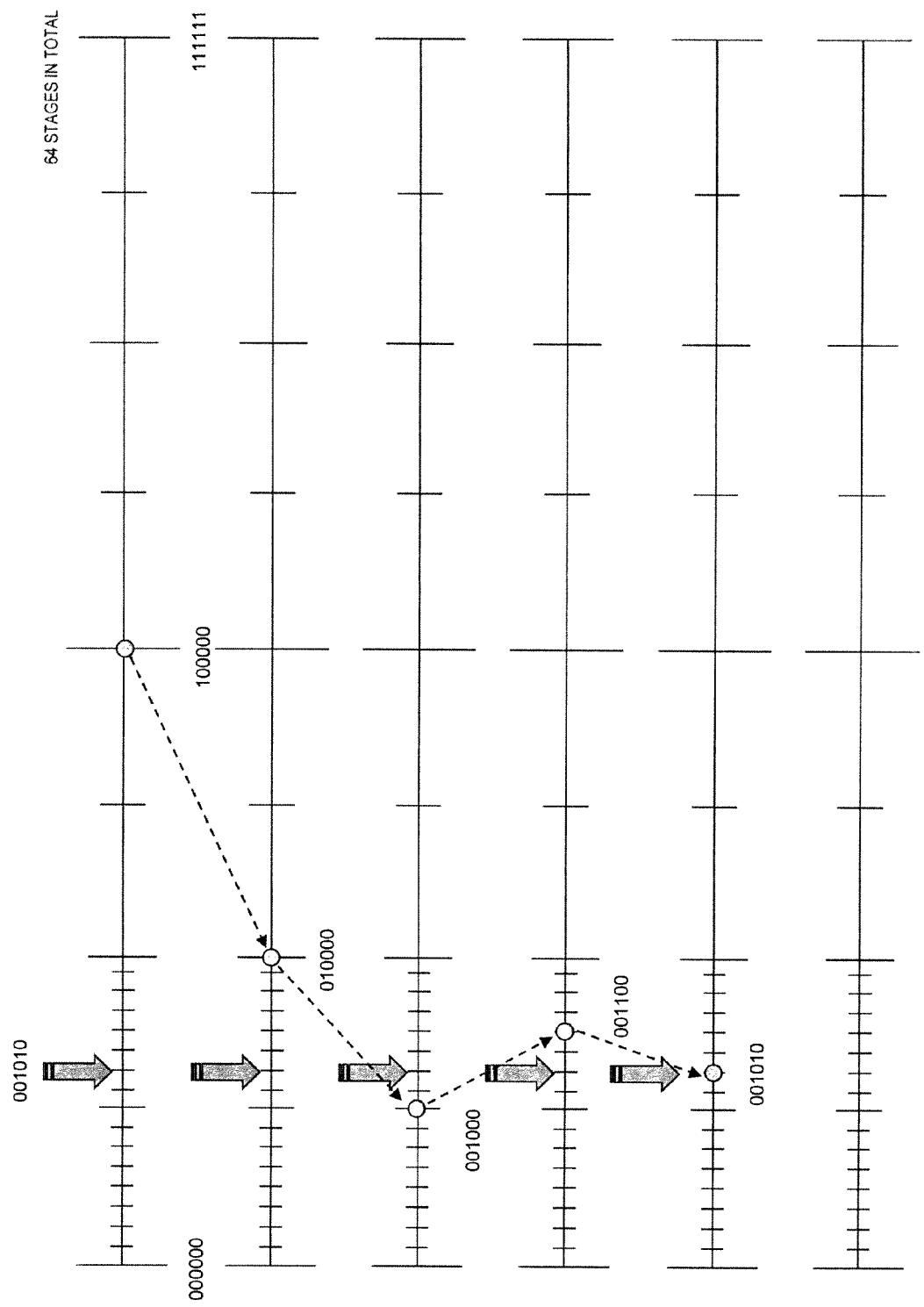
FIG. 10 is an exemplary diagram illustrating an operation of a counter circuit by binary search method.

In the semiconductor device, the counter circuit may up/down operate by means of binary search method (see FIG. 10).

Figure 11:
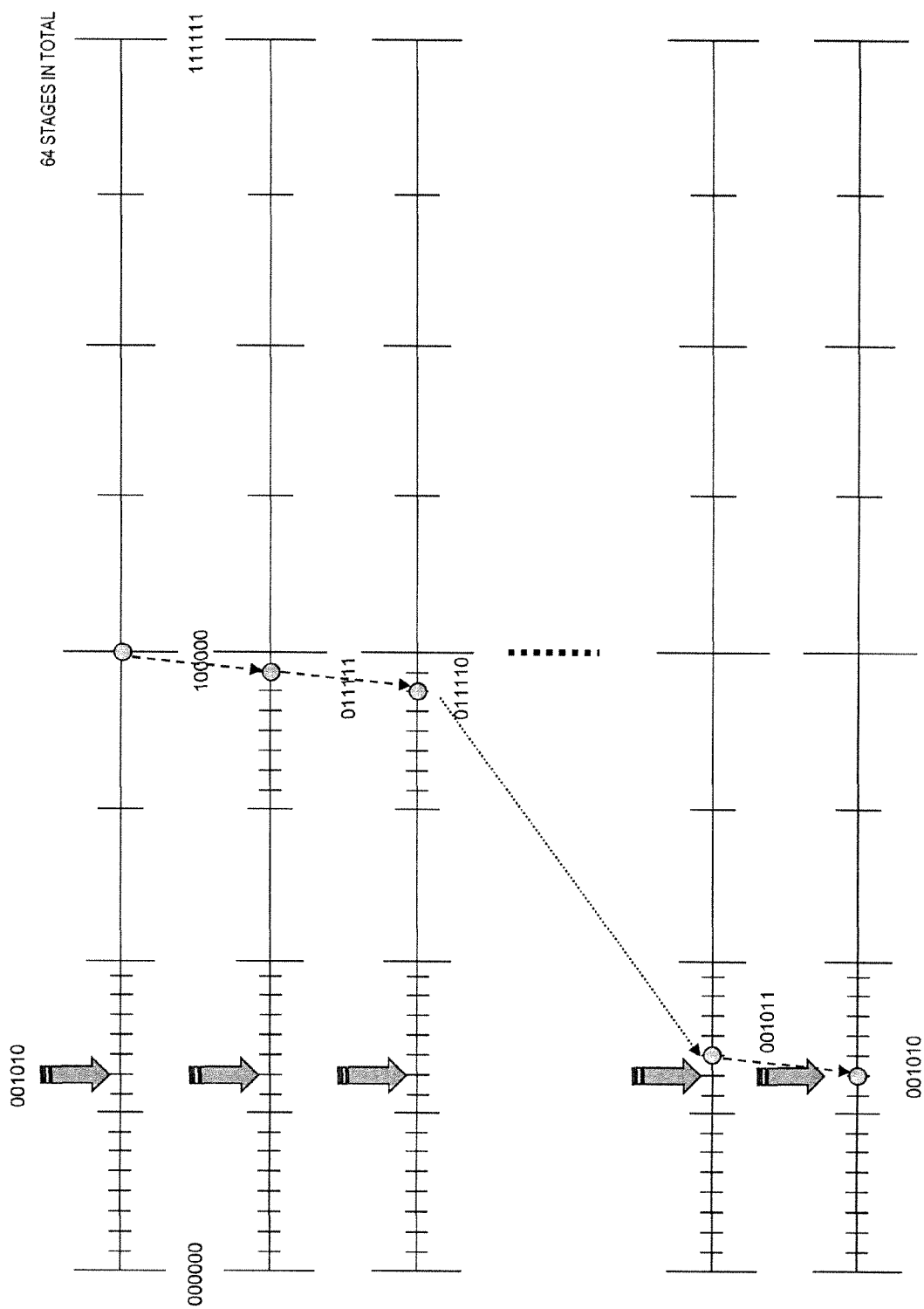
FIG. 11 is an exemplary diagram illustrating an operation of a counter circuit by linear search method.

In the semiconductor device, the counter circuit may up/down operate by means of linear search method (see FIG. 11).

The semiconductor device may further comprise an output unit (corresponding to 23, 24 in FIG. 1) that outputs data to outside in response to a read command, and the second clock signal may be a signal controlling an output timing of the output unit.

According to the semiconductor device mentioned above, an initial value of the count value depending upon the cycle of the first clock signal is set to the counter circuit at the time of initial setting operation. That is, the semiconductor device detects itself in which range the frequency of the first clock signal falls, an initial delay amount of the DLL circuit is set in response to the detected result in a self-alignment manner.

Setting such an initial delay amount makes it possible to finish adjusting the DLL circuit fast regardless of the frequency of the first clock signal.

The detailed description is given below concerning exemplary embodiments, making reference to the drawings.

<First Exemplary Embodiment>

FIG. 1 is a diagram showing a configuration of a semiconductor device in accordance with a first exemplary embodiment of the present disclosure. In FIG. 1, the semiconductor device that is a SDRAM (Synchronous Dynamic Random Access Memory) includes an address input circuit 11, an address latch circuit 12, a command input circuit 13, a command decode circuit 14, a mode register 15, a refresh control circuit 16, a column decoder 17, a row decoder 18, a memory cell array 19, a clock input circuit 20, a timing generator 21, a DLL circuit 22, a FIFO circuit 23, an input/output circuit 24, and an internal power supply generating circuit 25.

The address input circuit 11 receives an address signal ADD from outside and buffers to output the address signal ADD to the address latch circuit 12. The address latch circuit 12 latches the address signal ADD at a predetermined timing to output the latched address signal ADD to the mode register 15, the column decoder 17, and the row decoder 18.

The command input circuit 13 receives a row address strobe signal /RAS, a column address strobe signal /CAS, a write enable signal /WE, and a reset signal /RST from outside to output signals related to command to the command decoder circuit 14 and to output a mode signal MODE indicating a DRAM operation mode to the DLL circuit 22. The command decode circuit 14 decodes the signals related to command, outputs a decode timing of a column address to the column decoder 17, outputs a decode timing of a row address to the row decoder 18, outputs a mode setting timing to the mode register 15, and outputs a refresh timing to the refresh control circuit 16.

The mode register 15 sets the DRAM operation mode at the mode setting timing. The refresh control circuit 16 controls the row decoder 18 so that the row decoder 18 generates a refresh address in response to the refresh timing.

The column decoder 17 outputs a column address to the memory cell array 19, and the row decoder 18 outputs a row address to the memory cell array 19. And the memory cell array 19 accesses to a memory cell corresponding to the column address and the row address.

The clock input circuit 20 receives clock signals CK, /CK from outside and buffers to output a clock signal CLKIN to the timing generator 21 and the DLL circuit 22. The timing generator 21 distributes various timing signals synchronized with the clock signal CLKIN to each unit as needed, and respective timing signals control timings of signals transmitted in the semiconductor device. The DLL circuit 22 receives a clock signal CLKIN, a reset signal /RST, and a mode signal MODE to output a clock signal LCLK that is obtained by adjusting the phase of the clock signal CLKIN to the FIFO circuit 23 and the input/output circuit 24.

The FIFO circuit 23 disposed between the memory cell array 19 and the input/output circuit 24 buffers input/output data. The input/output circuit 24 outputs write data received from a DQ terminal to the FIFO circuit 23; the input/output circuit 24 outputs read data received from the FIFO circuit 23 to the DQ terminal. In this situation, the phase of a clock signal LCLK is adjusted so that data signal, which is outputted from the DQ terminal in synchronization with the clock signal LCLK, is synchronized with the external clock signal CK.

The internal power supply generating circuit 25 receives power supply voltages VDD, VSS from outside, and converts VDD, VSS into internal power supply voltages to supply to each unit.

Figure 2:
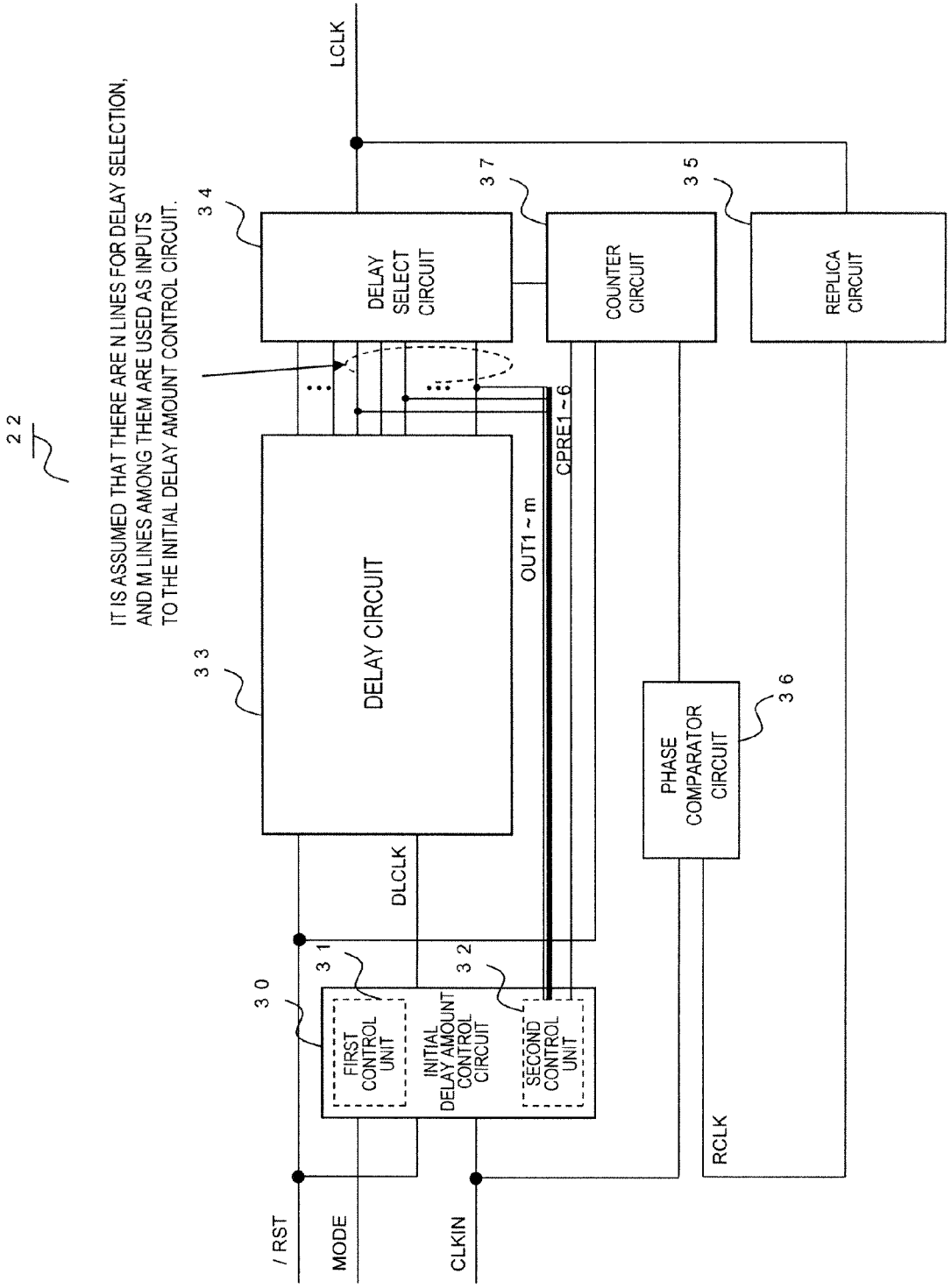
FIG. 2 is a diagram illustrating a configuration of a DLL circuit in accordance with the first exemplary embodiment.

Next, the DLL circuit 22 will be described in detail. FIG. 2 is a diagram of a configuration of a DLL circuit in accordance with the first exemplary embodiment of the present invention. The DLL circuit 22 includes an initial delay amount control circuit 30 having a first control unit 31 and a second control unit 32, a delay circuit 33, a delay select circuit 34, a replica circuit 35, a phase comparator circuit 36, and counter circuit 37.

The initial delay amount control circuit 30 receives a clock signal CLKIN, and at the time of initial setting operation in which a reset signal /BST non-active (not reset state) and a mode signal MODE indicates an initial setting state, the initial delay amount control circuit 30 determines a cycle of the clock signal CLKIN to output an initial value of a count value depending upon the determined cycle as preset signals CPRE1 to 6 to the counter circuit 37. At the time of normal operation in which a reset signal /RST is non-active and a mode signal MODE indicates a normal state, the initial delay amount control circuit 30 outputs the received clock signal CLKIN as a clock signal DLCLK to the delay circuit 33.

The delay circuit 33 is configured by a delay element group in which n delay elements are connected in series. When a reset signal /RST is non-active, the delay circuit 33 delays a clock signal DLCLK to output n signals OUT1 to OUTn having different delay times to each other to the delay select circuit 34, and to output m signals OUT1 to OUTm of n signals OUT1 to OUTn to the initial delay amount control circuit 30.

The delay select circuit 34 selects one signal among n signals OUT1 to OUTn based on a count value of the counter circuit 37 to output the signal as a clock signal LCLK to the replica circuit 35, the FIFO circuit 23, and the input/output circuit 24.

The replica circuit 35 is a circuit that delays a clock signal LCLK to output the delayed clock signal as a clock signal RCLK to the phase comparator circuit 36, and is a circuit that imitates the input/output circuits or the like to take into account the delay amount caused until data signal is outputted via the FIFO circuit 23 and the input/output circuit 24.

At the time of normal operation after initial setting, the phase comparator circuit 36 compares a phase of a clock signal CLKIN with a phase of a clock signal RCLK outputted via the replica circuit 35 to output the phase lead/delay information to the counter circuit 37.

After the counter circuit 37 sets an initial value depending upon the preset signals CPRE 1 to 6, the counter circuit 37 outputs a value of the counter to the delay select circuit 34 no as to adjust the delay amount in response to the phase lead/delay information of outputted from the phase comparator circuit 36. The counter circuit 37 operates by either binary search method that jumps to half of maximum value of the moving direction as shown in FIG. 10 or linear search method (increment type) that increases/decreases the delay amount step by step as shown in FIG. 11.

Next, the initial delay amount control circuit 30 that plays an importance role in the present invention will be described.

Figure 5:
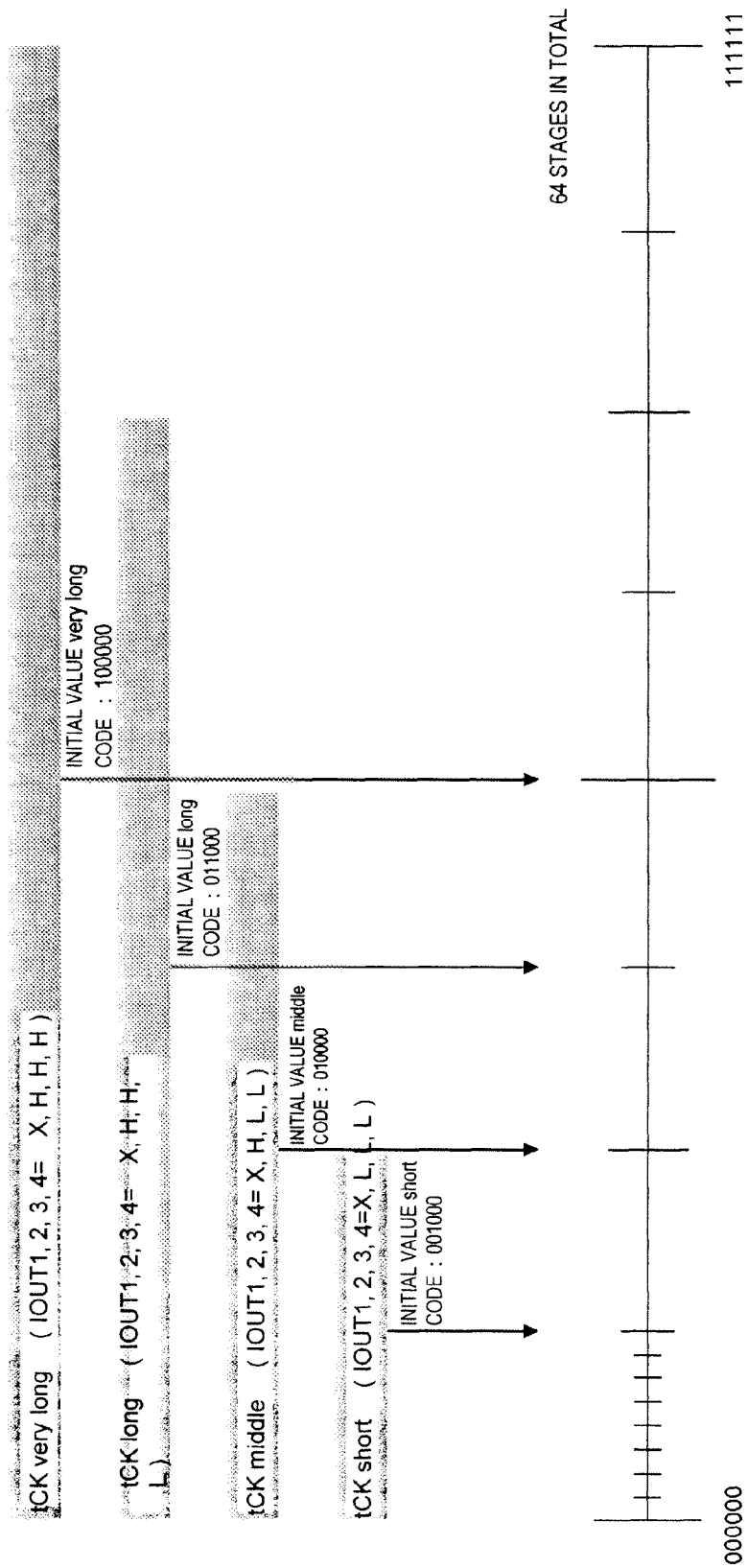
FIG. 5 is a schematic view showing how to set preset signals according to a cycle of a clock signal.

After a reset operation (a reset signal /RST is non-active), a first control unit 31 receives a mode signal MODE that is activated at the time of initial setting operation (at the time of operation start), and controls so as to output signals OUT1 to OUTm that indicate initial delay information in the delay circuit 33. The OUT1 to OUTm are outputs of the delay circuit 33. For example, in a case where the number of stages of the delay circuit 33 is 64, all the 64 lines are not needed, and a range capable of discriminating the initial delay amount is enough to use (m=4 in FIG. 5 shown later).

Figure 3:
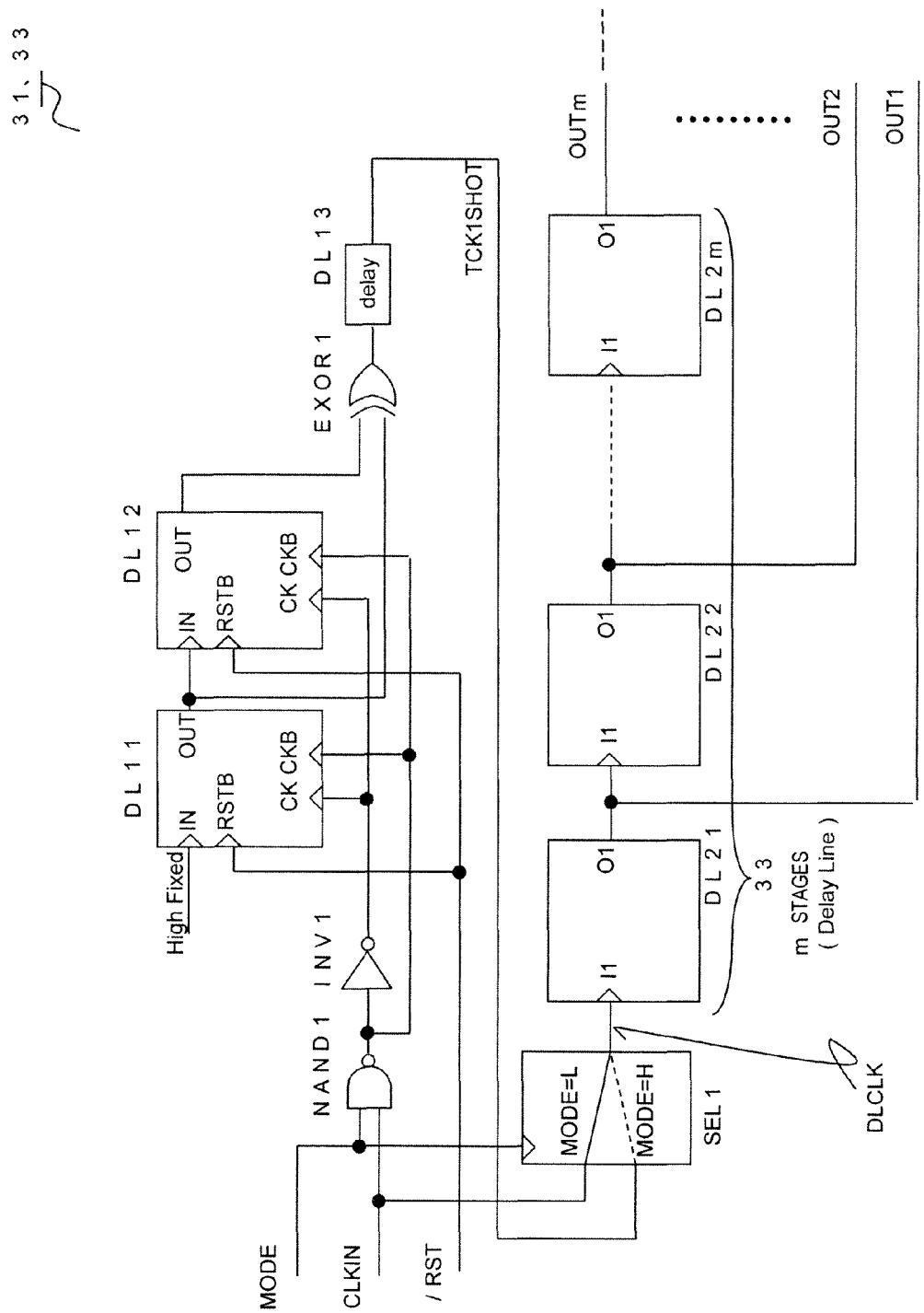
FIG. 3 is a circuit diagram of a first control unit and a delay circuit in accordance with the first exemplary embodiment.

FIG. 3 is a circuit diagram of the first control unit 31 and the delay circuit 33. The first control unit 31 includes a NAND circuit NAND1, an inverter circuit INV1, delay circuits DL11, DL12, DL13, an exclusive logical sum circuit EXOR1, and a selector SEL1. The delay circuit 33 includes delay circuits DL21 to DL2m.

The NAND circuit NAND1 receives a mode signal MODE at one input terminal and a clock signal CLKIN at the other input terminal to output an inverted logical product output to each of inverting clock input terminals of delay circuits DL11 and DL12. The inverter circuit INV1 inverts the output of the NAND circuit NAND1 to output the inverted NAND output to each of clock input terminals of delay circuits DL11, DL12. The delay circuit DL11 is reset when a reset signal /RST is L level. The input terminal of the delay circuit DL11 is held to H level, and the output of the delay circuit DL11 is connected to the input terminal of the delay circuit DL12. The delay circuit DL12 is reset when a reset signal /RST is L level.

One input terminal of the exclusive logical sum circuit EXOR1 is connected to the output terminal of the delay circuit DL11, and the other input terminal of EXOR1 is connected to the output terminal of the delay circuit DL12. The exclusive logical sum circuit EXOR1 outputs an exclusive logical sum output to the delay circuit 13. The delay circuit DL13 delays an output signal of the exclusive logical sum circuit EXOR1 to output the delayed signal as one shot pulse signal TCK1SHOT to one input terminal of a selector SEL1.

The selector SEL1 receives a clock signal CLKIN at the other input terminal. When a mode signal MODE is L level (at the normal operation), the selector SEL1 selects the clock signal CLKIN; whereas when the mode signal MODE is H level (at the initial setting operation), the selector SEL1 selects the one shot pulse signal TCK1SHOT to output the one shot pulse signal TCK1SHOT as a clock signal DLCLK to the delay circuit DL21.

The delay circuits DL21 to DL2m are connected in series, and output signals OUT1 to OUTm that have different delay time to each other to the second control unit 32 and the delay select circuit 34 respectively. Meanwhile, the delay circuit 33 further includes delay circuits DL2m+1 to DL2n that follow the delay circuit DL2m and are not shown in the drawing, and they output signals OUTm+1 to OUTn having different delay time to each other only to the delay select circuit 34.

Figure 4:
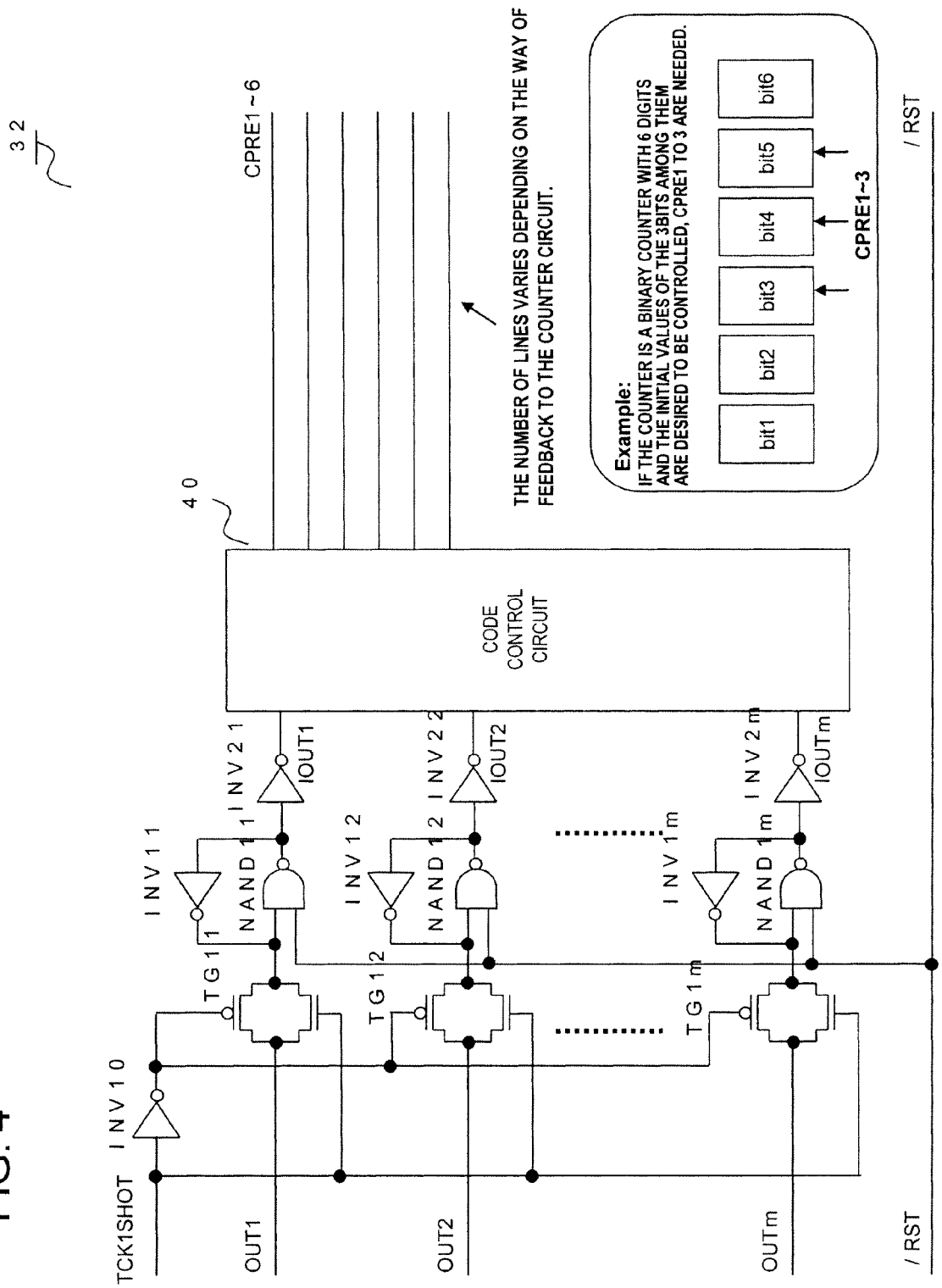
FIG. 4 is a circuit diagram of a second control unit in accordance with the first exemplary embodiment.

FIG. 4 is a circuit diagram of the second control unit 32. The second control unit 32 includes transfer gates TG11 to TG1m, NAND circuits NAND11 to NAND1m, inverter circuits INV10 to INV1m. INV21 to INV2m, and a code control circuit 40.

The transfer gate TG1j (j=1 to receives the one shot pulse signal TCK1SHOT and an inverted signal of the one shot pulse signal TCK1SHOT via the inverter circuit INV10 at a control terminal. When the one shot pulse signal TCK1SHOT is H level, the signal OUTj is transferred to one input terminal of the NAND circuit NAND1j; whereas when the one shot pulse signal TCK1SHOT is L level, the transfer gate TG1j becomes a non-conductive state.

The NAND circuit NAND1j receives a reset signal /RST at the other input terminal. The output terminal of NAND circuit NAND1j is connected to one input terminal of NAND circuit NAND1j via the inverter circuit INV1j, and the output terminal of NAND circuit NAND1j is connected to an input terminal of the code control circuit 40 via the inverter circuit INV2j. When a reset signal /RST is H level and the transfer gate TG1$j$ is in a conductive state, the NAND circuit NAND1$j$ and the inverter circuit INV1$j$ configure a latch circuit that latches the signal OUT$j$.

The code control circuit 40 outputs the preset signals CPRE1 to 6 that sets initial count information of the counter circuit based on the signals IOUT1 to IOUTm that indicate the initial delay information. That is, the code control circuit 40 converts output signals of the inverter circuits INV21 to INV2$m$ that constitute a thermometer code into the preset signals CPRE1 to 6 that constitute a binary code, and outputs the preset signals CPRE1 to 6.

The second control unit 32 configured as shown above receives the signals IOUT1 to IOUTm to output preset signals CPRE1 to 6 for presetting the counter circuit 37 to the counter circuit 37 in response to the signals IOUT1 to IOUTm. By setting an initial value of the counter circuit 37 by the preset signals CPRE1 to 6, the delay select circuit 34 is set with respect to which of the signals OUT1 to OUTm is selected to output as a clock signal LCLK, and operates so as to select the initial delay amount. Here, a case where the preset signals consist of six signals so that the number of delay stages is $2^6=64$ stages is shown as an example. However, the number of delay stages is not limited to this value.

FIG. 5 is a schematic view illustrating how the preset signals CPRE1 to 6 is set in response to a cycle tCK of a clock signal CLKIN. In FIG. 5, for example, it is assumed that tCK=long. In a case where IOUT1, 2, 3, 4=X, H, H, L (X is not cared), an initial code (long) "011000" is set to the preset signals CPRE1 to 6 in response to the signals IOUT2, 3, 4. Meanwhile, in FIG. 5, only the high-order 3 bits of 6 bits code can be varied, and the low-order 3 bits are fixed to "000". However, these bit numbers may be varied based on a range of initial delay amount that is desired to be set.

While a mode signal MODE is activated after a reset operation (indicating the initial operation), the first control unit 31 and the delay circuit 33 generate a one shot pulse signal TCK1SHOT corresponding to a cycle of a clock signal CLKIN, and the rising edge of the one shot pulse signal TCK1SHOT is transmitted to the signals OUT1 to OUTm.

And in the second control unit 32, while the one shot pulse signal TCK1SHOT is H level, transfer gates TG11 to TG1$m$ are conductive, and each of the signal levels of the signals OUT1 to OUTm is latched at each of latch circuits (the inverter circuit INV11 and the NAND circuit NAND11 to the inverter circuit INV1$m$ and the NAND circuit NAND1$m$). That is, it is measured which of the signals OUT1 to OUTm the rising edge of the one shot pulse signal TCK1SHOT is transmitted to while the one shot pulse signal TCK1SHOT is H level. The longer the cycle of the clock signal CLKIN is, the higher number of the signals transit to H level in order of the signals OUT1 to OUTm.

Figure 6:
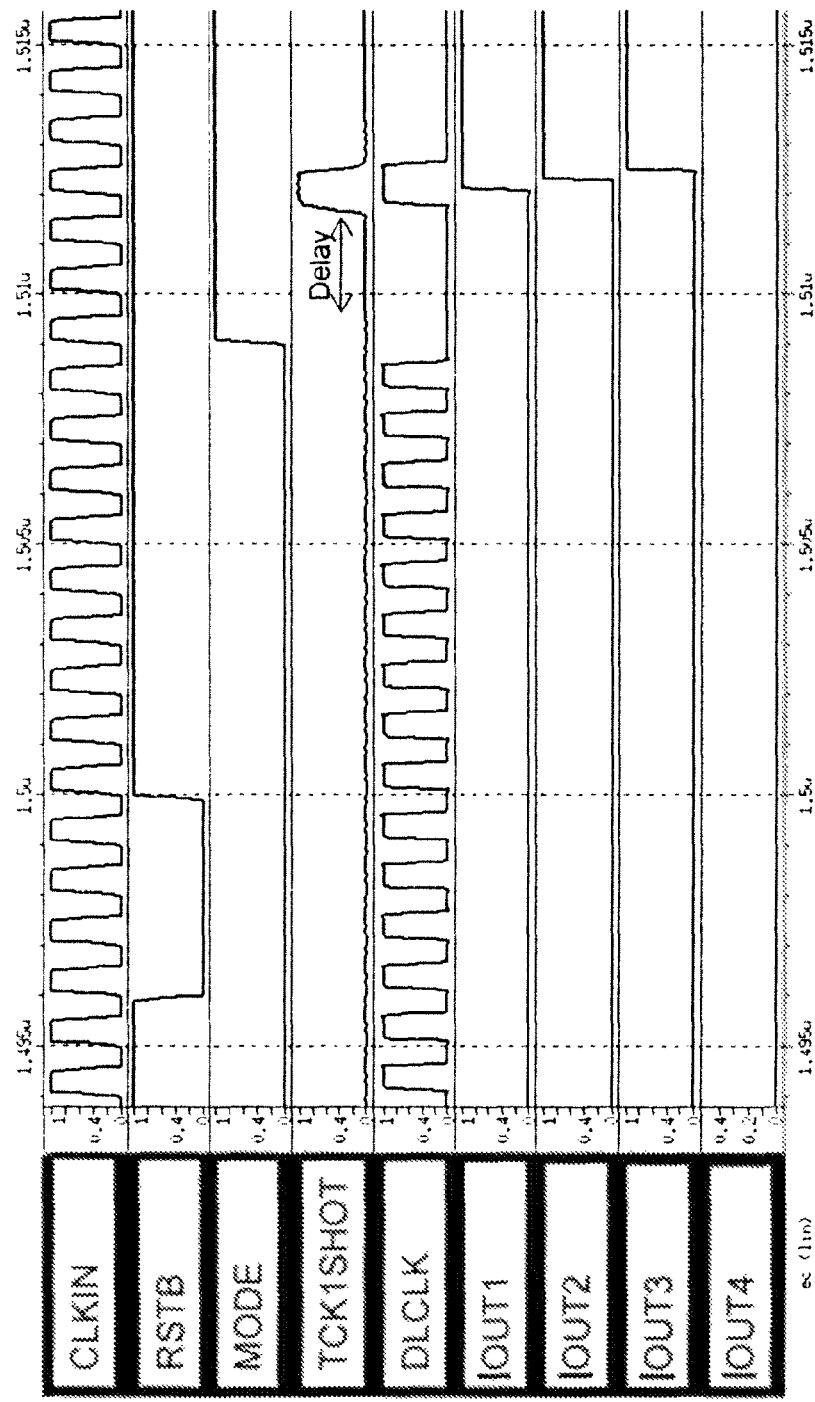
FIG. 6 shows an example of waveforms operating at various parts of the first control unit and the delay circuit in accordance with the first exemplary embodiment.

FIG. 6 shows an example of waveforms operating at various parts of the first control circuit unit 31 and the delay circuit 33. In FIG. 6, when a predetermined period is passed after a mode signal MODE turns H level, a one shot pulse TCK1SHOT is generated. The one shot pulse signal TCK1SHOT is transmitted as a clock signal DLCLK through the delay circuits DL21 to DL2$m$. It is shown that the signals IOUT1 to IOUT3 are H level, and the signal(s) beginning from the signal IOUT4 is L level while the one shot pulse signal TCK1SHOT is H level. With reference to FIG. 5, a code of the signals IOUT1 to IOUTm corresponds to tCK long, and the second control unit 32 sets CPRE1 to 6=(011000) as an initial value of the counter circuit 37.

<Second Exemplary Embodiment>

Figure 7:
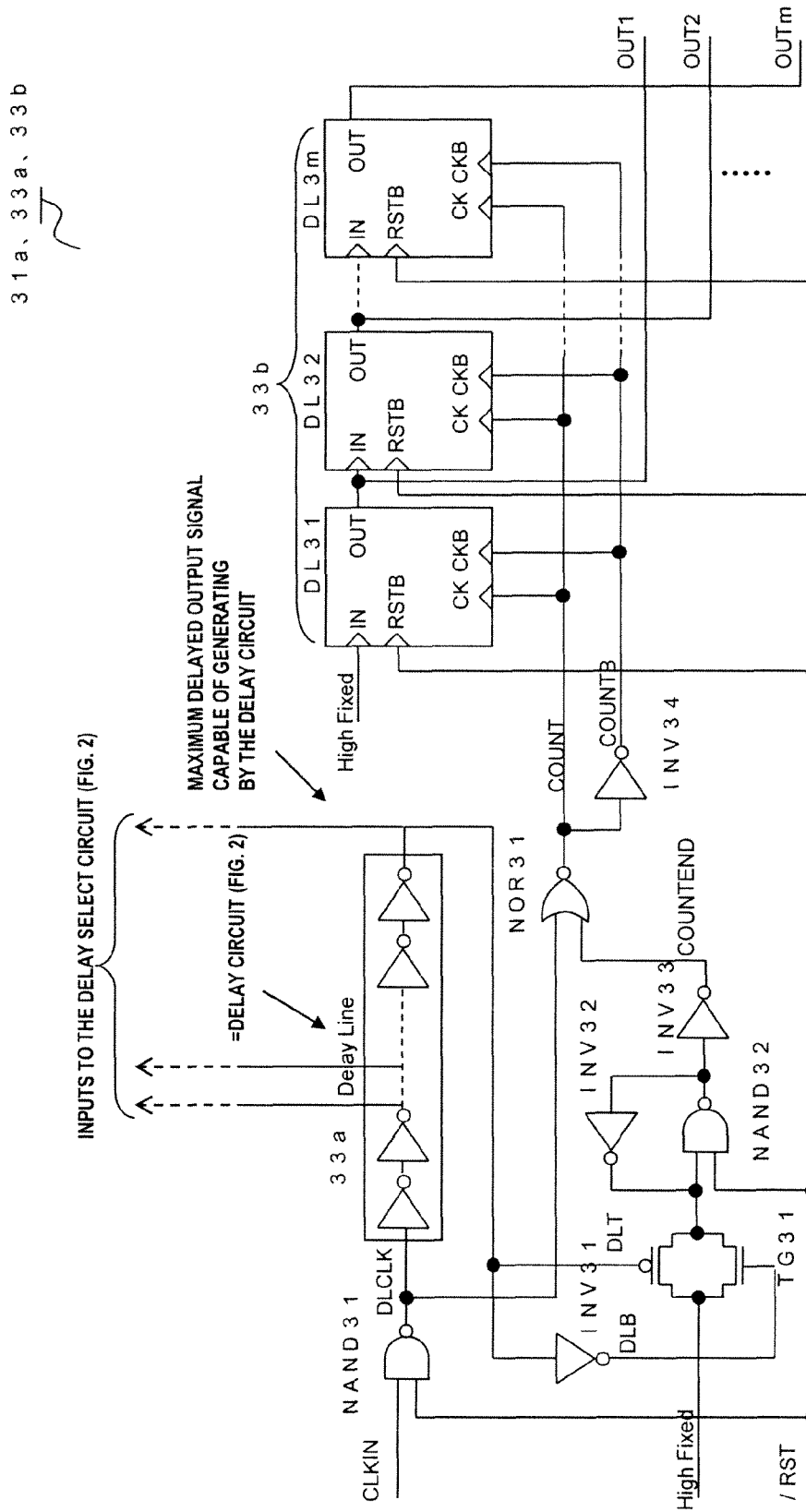
FIG. 7 is a circuit diagram of a first control unit and a delay circuit in accordance second exemplary embodiment of the present disclosure.

FIG. 7 is a circuit diagram of a first control circuit and a delay circuit in accordance with a second exemplary embodiment of the present invention. In FIG. 7, the first control unit 31$a$ includes NAND circuits NAND 31, 32, a NOR circuit NOR31, inverter circuits INV31 to INV34, and a transfer gate TG31. Two delay circuits 33$a$, 33$b$ are included as the delay circuit. The delay circuit 33$a$ is configured as a multi-stage inverter circuit or a buffer circuit, and the delay circuit 33$b$ includes delay circuits DL31 to DL3$m$.

The NAND circuit NAND 31 receives a clock signal CLKIN at one input terminal, and receives a reset signal /RST at the other input terminal to output an inverted logical product output to the input terminal of the delay circuit 33$a$ and one input terminal of the NOR circuit NOR31. The delay circuit 33$a$ outputs each of signals corresponding to the signals OUT1 to OUTn of FIG. 2 from each stage to the delay select circuit 34.

The transfer gate TG31 receives an output signal DLT of the last stage of the delay circuit 33$a$ and a signal DLB which is obtained by inverting the output signal DLT by the inverter circuit INV31 at the control terminals. If the output signal DLT is L level, the transfer gate TG31 transfers H level to one input terminal of the NAND circuit 32; whereas if the output signal DLT is H level, the transfer gate TG31 becomes a non-conductive state.

The NAND circuit NAND32 receives a reset signal /RST at the other input terminal; the output terminal of NAND32 is connected to one input terminal of NAND circuit NAND32 via the inverter circuit 32 and also connected to the other input terminal of the NOR circuit 31 via the inverter circuit INV33. If the reset signal /RST is H level and the transfer gate TG31 is in a conductive state, the NAND circuit NAND32 and the inverter circuit INV32 configure a latch circuit that latches the H level.

The NOR circuit NOR31 outputs a signal COUNT that is an inverted logical sum output to each of clock input terminals of the delay circuits DL31 to DL3$m$. The inverter circuit INV34 logically inverts the signal COUNT to output as a signal COUNTB to each of inverting clock input terminals of the delay circuit DL31 to DL3$m$. The delay circuits DL31 to DL3$m$ is reset if a reset signal /RST is L level. The input terminal of the delay circuit DL31 is held to H level, and the output of the delay circuit DL31 is connected to the input terminal of the delay circuit DL32. The output of the delay circuit DL3$k$ (k=1 to m−1) is connected to the input of the delay circuit DL3$k$+1 and DL3$k$ is a signal OUTk. The output of the delay circuit DL3$m$ is a signal OUTm.

Figure 8:
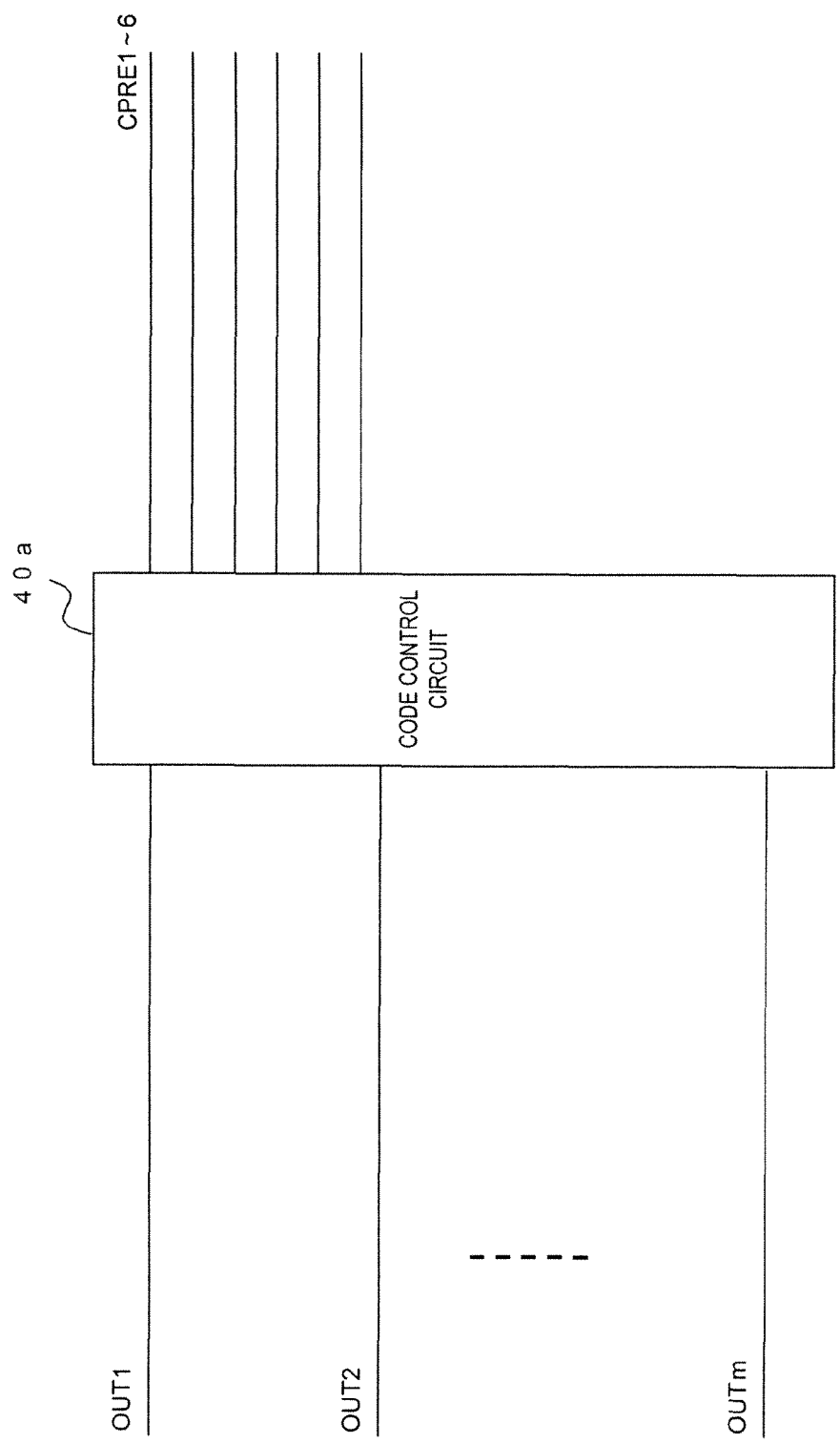
FIG. 8 is a circuit diagram of a second control unit in accordance with the second exemplary embodiment.

FIG. 8 is a circuit diagram of a second control unit in accordance with the second exemplary embodiment of the present invention. The second control unit 32$a$ includes a code control circuit 40$a$, which is the same as the code control circuit 40 of FIG. 4, and the code control circuit 40$a$ directly receives the signals OUT1 to OUTm of FIG. 7.

According to the first control unit 31$a$ and the delay circuit 33$a$ configured as shown above, if a reset signal /RST is at L level that indicates an active state, the clock signal DLCLK that is output of the NAND circuit NAND31 is H level; the signal DLT that is output of the delay circuit 33$a$ is H level; and the transfer gate TG31 is in a nonconductive state. All the signals OUT1 to OUTm are L level.

If the reset signal /RST transits to H level that indicates a non-active state, the clock signal CLKIN is transmitted via the NAND circuit NAND31 and the NOR circuit NOR31 as signals COUNT and COUNTB to each of the clock input terminals and the inverting clock input terminals of the delay circuits DL31 to DL3$m$. The delay circuits DL31 to DL3$m$ operate as a counter of a thermometer code synchronized with the signal COUNT.

When the signal DLT that is an output of the delay circuit 33a turns to be L level by transmitting the clock signal DLCLK through the delay circuit 33a, the transfer gate TG31 becomes a conductive state. Thus, both of two inputs of the NAND circuit NAND32 are H level, and so a signal COUNTEND is H level, and the NOR circuit NOR31 prevents the clock signal DLCLK from transmitting to the delay circuits DL31 to DL3m. That is, the delay circuit 33b stops the operation.

As shown above, the first control unit 31a and the delay circuit 33a operate, and the clock signal DLCLK transmits through the delay circuit 33a, so that the information about how many times the clock signal CLKIN is counted within the maximum delay time of the delay circuit 33a is obtained as the signals OUT1 to OUTm. The longer the cycle of the clock signal is, the lower the count number becomes; whereas the shorter the cycle of the clock signal is, the higher the count number becomes. That is, it is measured which of the signals OUT1 to OUTm the signal the H level is transmitted to within the maximum delay time of the delay circuit 33a. The longer the cycle of the clock signal CLKIN is, the lower number of signals transit to H level in order of the signals OUT1 to OUTm.

Figure 9:
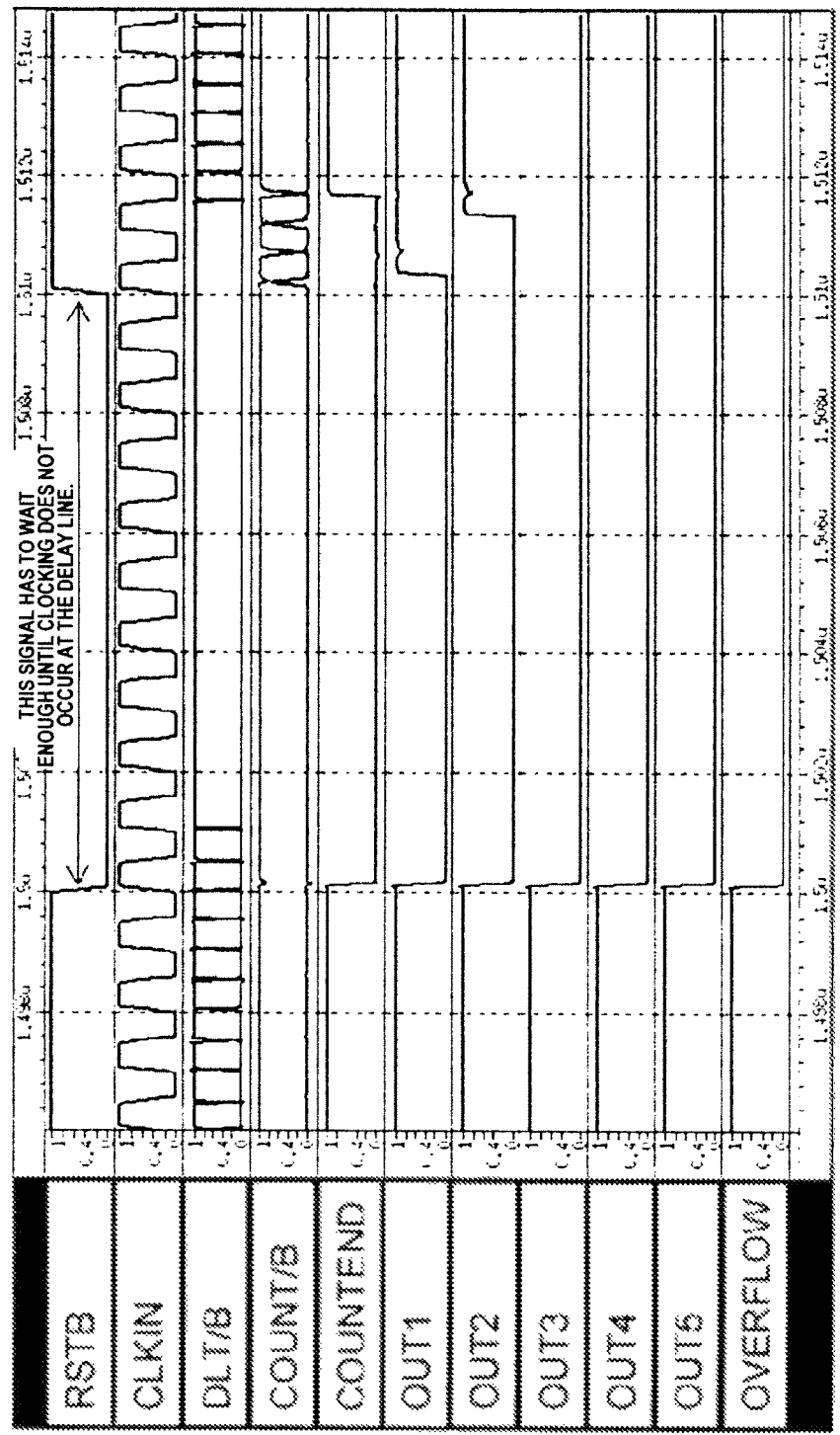
FIG. 9 shows an example of waveforms operating at various parts of the control unit and the delay circuit in accordance with the second exemplary embodiment.

FIG. 9 shows an example of waveforms operating at various parts of the first control unit 31a and the delay circuit 33b. In FIG. 9, reset signal /RST is held to L level until a signal DLT that is output of the delay circuit 33a does not vary. When the reset signal /RST transits to H level, a clock signal CLKIN is transmitted through the delay circuit 33a as a clock signal DCLK; after the delay time of the delay circuit 33a, the transfer gate TG31 becomes a conductive state. During a period until the transfer gate TG31 becomes a conductive state, that is, the signal COUNTEND transits to H level, it is shown that the signals OUT1, 2 transit to H level, and signals beginning from the signal OUT3 are L level. With reference to FIG. 5, a code of the signals OUT1 to OUTm corresponds to tCK middle, and the second control unit 32a sets CPRE1 to 6=(010000) as an initial value of the counter circuit 37.

In the first exemplary embodiment, a cycle of a clock signal CLKIN is measured based on the information: "where the signal of H level is transmitted to during a cycle of one shot pulse signal". On the other hand, in the present exemplary embodiment, the information: "how many times the clock signal is counted during a predetermined period" is used. That is, it is used that the longer the cycle of the clock signal CLKIN is, the lower the count number becomes; whereas the shorter the cycle of the clock signal CLKIN is, the higher the count number becomes. Since the other controls are the same as in the first exemplary embodiment, the explanations are omitted.

The entire disclosure of the above-mentioned Patent Documents etc. is incorporated herein by reference thereto. The exemplary embodiments and examples may include variations and modifications without departing the gist and scope of the present invention as disclosed herein and claimed as appended herewith, and furthermore based on the fundamental technical spirit. It should be noted that any combination and/or selection of the disclosed elements may fall within the claims of the present invention. That is, it should be noted that the present invention of course includes various variations and modifications that could be made by those skilled in the art according to the overall disclosures including claims and technical spirit.

What is claimed is:

1. A semiconductor device comprising a DLL (Delay Locked Loop) circuit, wherein said DLL circuit comprises:
a delay unit generating a second clock signal by delaying a first clock signal;
a phase comparator circuit comparing said first clock signal and a signal generated by further delaying said second clock signal;
a counter circuit outputting a count value that determines a delay amount of said delay unit to said delay unit, and up/down operating in response to a result of the phase comparison by said phase comparator circuit; and
an initial delay amount control circuit detecting a cycle of said first clock signal at the time of initial setting operation, and outputting an initial value of said count value depending upon the detected cycle to said counter circuit,
wherein said initial delay amount control circuit comprises:
a pulse signal generating unit generating a pulse signal having a pulse width proportional to the cycle of said first clock signal;
a plurality of delay elements connected in series delaying said pulse signal;
a detection unit detecting which of a plurality of delay elements said pulse signal is transmitted to during said pulse width of said pulse signal; and
a code generation unit generating the initial value of said count value based on a result detected by said detection unit.

2. A semiconductor device comprising a DLL (Delay Locked Loop) circuit, wherein said DLL circuit comprises:
a delay unit generating a second clock signal by delaying a first clock signal;
a phase comparator circuit comparing said first clock signal and a signal generated by further delaying said second clock signal;
a counter circuit outputting a count value that determines a delay amount of said delay unit to said delay unit, and up/down operating in response to a result of the phase comparison by said phase comparator circuit; and
an initial delay amount control circuit detecting a cycle of said first clock signal at the time of initial setting operation, and outputting an initial value of said count value depending upon the detected cycle to said counter circuit,
wherein said initial delay amount control circuit counts number of pulses included in said first clock signal during a predetermined period, and generates the initial value of said count value based on a result of the count.

3. A semiconductor device comprising a DLL (Delay Locked Loop) circuit, wherein said DLL circuit comprises:
a delay unit generating a second clock signal by delaying a first clock signal;
a phase comparator circuit comparing said first clock signal and a signal generated by further delaying said second clock signal;
a counter circuit outputting a count value that determines a delay amount of said delay unit to said delay unit, and up/down operating in response to a result of the phase comparison by said phase comparator circuit; and
an initial delay amount control circuit detecting a cycle of said first clock signal at the time of initial setting operation, and outputting an initial value of said count value depending upon the detected cycle to said counter circuit; and
an output unit that outputs data to outside in response to a read command,
wherein said second clock signal comprises a signal controlling an output timing of said output unit.

4. The semiconductor device according to claim 3, wherein said counter circuit up/down operates by a binary search method.

5. The semiconductor device according to claim 3, wherein said counter circuit up/down operates by a linear search method.

6. A semiconductor device comprising:
a counter circuit storing code information;
a delay control circuit receiving a first clock signal and producing a second clock signal, a difference in phase between the first and second clock signals being controlled by the code information; and
an initial code control circuit receiving the first clock signal and controlling an initial value of the code information in response to a length of a clock cycle period of the first clock signal,
wherein the initial code control circuit sets the initial code to a first value when the length of the clock cycle period of the first clock signal is a first length and sets the initial code to a second value greater than the first value when the length of the clock cycle period of the first clock signal is a second length longer than the first length.

7. The semiconductor device according to claim 6, further comprising:
a data output circuit outputting data in synchronism with the second clock signal;
a replica circuit replicate of the data output circuit, the replica circuit receiving the second clock signal and producing a third clock signal; and
a phase comparator circuit receiving the first and third clock signals, comparing phases of the first and third clock signals with each other, and updating the code information from the initial value in response to a result of the comparing.

8. The semiconductor device according to claim 6, wherein the delay control circuit includes a delay circuit receiving the first clock signal and producing a plurality of fourth clock signals, the fourth clock signals being different in phase from one another and wherein the initial code control circuit includes:
a pulse control circuit receiving the first clock signal and producing a pulse signal, a width of the pulse signal being determined in response to the length of a clock cycle period of the first clock signal, the width of the pulse signal being defined as an active period of the pulse signal;
a plurality of gate circuits each including an output node, a control gate receiving the pulse signal and an input node receiving a corresponding one of the fourth clock signals, allowing the corresponding one of the fourth clock signals to pass therethrough during the active period of the pulse signal, and inhibiting the corresponding one of the fourth clock signals from passing therethrough during an inactive period other than the active period of the pulse signal; and
a code control circuit coupled to each of the output nodes of the gate circuits, generating the initial value of the code information based on a selected one or ones of the fourth clock signals respectively supplied with the output nodes.

9. A semiconductor device comprising:
a counter circuit storing code information;
a delay control circuit receiving a first clock signal and producing a second clock signal, a difference in phase between the first and second clock signals being controlled by the code information; and
an initial code control circuit receiving the first clock signal and controlling an initial value of the code information in response to a length of a clock cycle period of the first clock signal,
wherein the delay control circuit includes:
a delay circuit receiving the first clock signal and producing a plurality of fourth clock signals, the fourth clock signals being different in phase from one another; and
a delay select circuit receiving the fourth clock signals, selecting one of the fourth clock signals in response to the code information and producing the one of the fourth clock signals as the second clock signal.

10. A semiconductor device comprising:
a counter circuit configured to store code information;
a delay control circuit configured to receive a first clock signal and to produce a second clock signal, a difference between the first and second clock signals being controlled by the code information; and
an initial code control circuit configured to receive the first clock signal, to set an initial value of the code information to a first value when a length of a clock cycle period of the first clock signal is a first length, and to set the initial value of the code information to a second value different from the first value when the length of the clock cycle period of the first clock signal is a second length different from the first length.

11. The semiconductor device according to claim 10, wherein the initial code control circuit is configured to count a number of pulses of the first clock signal during a predetermined period to determine the initial value of the code information.

12. The semiconductor device according to claim 10, further comprising:
a plurality of memory cells; and
an output circuit that outputs data stored in the memory cells, the output circuit being configured to output the data in synchronism with the second clock signal.

13. The semiconductor device according to claim 10, wherein the first value is greater than the second value when the first length is longer than the second length.

* * * * *